US006822885B2

(12) United States Patent
Bunce et al.

(10) Patent No.: US 6,822,885 B2
(45) Date of Patent: Nov. 23, 2004

(54) HIGH SPEED LATCH AND COMPARE FUNCTION

(75) Inventors: Paul A. Bunce, Poughkeepsie, NY (US); John D. Davis, Maybrook, NY (US); Donald W. Plass, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 43 days.

(21) Appl. No.: 10/413,615

(22) Filed: Apr. 14, 2003

(65) Prior Publication Data

US 2004/0202026 A1 Oct. 14, 2004

(51) Int. Cl.[7] .................................................. G11C 7/00
(52) U.S. Cl. ................ 365/45; 365/189.05; 365/189.07; 326/52
(58) Field of Search .............................. 365/45, 189.07, 365/189.05; 326/52

(56) References Cited

U.S. PATENT DOCUMENTS

| | | | | |
|---|---|---|---|---|
| 5,617,348 A | * | 4/1997 | Maguire | 365/49 |
| 6,747,909 B2 | * | 6/2004 | Kang | 365/230.06 |
| 2003/0117170 A1 | * | 6/2003 | Meneghini | 326/52 |

* cited by examiner

Primary Examiner—Vu A. Le
(74) Attorney, Agent, or Firm—Lynn Augspurger; Richard Goldman

(57) ABSTRACT

A high speed latch and compare function providing rapid cache comparison through the use of a dual rail comparison circuit having transmission gate exclusive or (XOR) circuits.

12 Claims, 3 Drawing Sheets

HIGH SPEED LATCH AND COMPARE FUNCTION

FIELD OF THE INVENTION

The invention described herein relates to microprocessor cache apparatus.

BACKGROUND OF THE INVENTION

Directory macro's are microprocessor cache components that are used to determine if a particular address is currently held in the main cache RAM. FIG. 1 (denominated "Prior Art") shows a typical cache directory RAM scheme. The directory RAM holds a portion of the addresses stored in the main cache RAM. A portion of the full address is used to retrieve and latch an entry from the RAM. Another portion of the address (tag) is then compared against the latched entry from the RAM. If the tag matches the entry retrieved from the RAM, the cache is said to have found a "hit".

FIG. 2 (denominated "Prior Art") shows the typical logic flow from the RAM output to the generation of the hit signal. A set of bits from the RAM are compared bit by bit with the corresponding tag bits using an XOR gate. The output of any XOR would be a "1" if the corresponding RAM bit and tag bit mismatched. If none of the XOR gates generate a mismatch, the output of the second stage nor gate will be a "1", meaning the cache found a hit. The speed at which the cache can operate is directly affected by how long it takes for this compare structure to evaluate.

OBJECTS OF THE INVENTION

It is a primary object of the invention to provide a minimum delay cache RAM match/mismatch detection circuit.

It is a further object of the invention to eliminate the delay associated with complementing of the latched data.

It is still a further object of the invention to provide reduced delay XOR logic in the compare function.

SUMMARY OF THE INVENTION

These objects are attained by the apparatus of our invention. The apparatus of the invention provides a low delay circuit for generating a RAM cache "match/mismatch" signal.

Specifically, our invention provides a dual rail output from the RAM and associated latches, typically two latches, one latch to indicate if a "0" was read from the RAM and the other to indicate if a "1" was read from the RAM. In addition to removing the delay associated with generating the complement of the latch data as in the prior art, the use of a transmission gate XOR (instead of the gate input XOR of the prior art) further reduces circuit delay. This combination of eliminating generation of the complement of the latch data and using a transmission gate XOR in place of a gate input XOR provides a low delay compare function.

In a preferred exemplification the apparatus has tag and data inputs. The data inputs are dual-rail inputs sourcing latch pairs, where one of the latch pairs latches true-data and one of said latch pairs latches complement-data. The latch and compare apparatus further includes two sets of transistor pairs, one set of the gates receiving data from the true and complement outputs of the true-data latch, and another set of the gates receiving data from the complement and true outputs of the complement-data latch. The transistor pairs hold and drive signals from the latch pairs. The apparatus has a pair XOR transmission gates with one XOR transmission gate transistor pair receiving as gate inputs tag and inverted tag signals, and the other XOR transmission gate pair receiving as gate inputs inverted tag and tag inputs. One of the XOR transmission gate transistor pairs receives a true-data signal, and the other of the XOR transmission gate transistor pairs receives a complement-data signal. The XOR transmission gate pair outputs a match-mismatch signal.

In the apparatus the data input may be pairs of true-complement bit column inputs comprising an input for each data bit column, and the tag input may be an input signal comprising an input for each tag bit.

The transmission gates are in series with said data inputs, and the latch pairs are in series with the data inputs, with one of the latch pairs latching true-data inputs and one of the latch pairs latching complement-data inputs.

THE FIGURES

Various embodiments and exemplifications of our invention are illustrated in the FIGURES appended hereto.

DETAILED DESCRIPTION OF THE INVENTION

The invention implements a high speed latch and compare function. The invention, shown in FIG. 3, eliminates significant delay from prior art implementations by using a dual rail/dual latch approach in combination with a transmission gate implementation the XOR function. The invention does not suffer from the charge sharing hazard found in some compare circuits of the prior art and does not include any delay penalty that would be imposed by other prior art implementations. This invention also has the added benefit of removing the delay associated with overpowering the latch feedback inverter in the path from the RAM output to the mismatch node.

Figure 1:
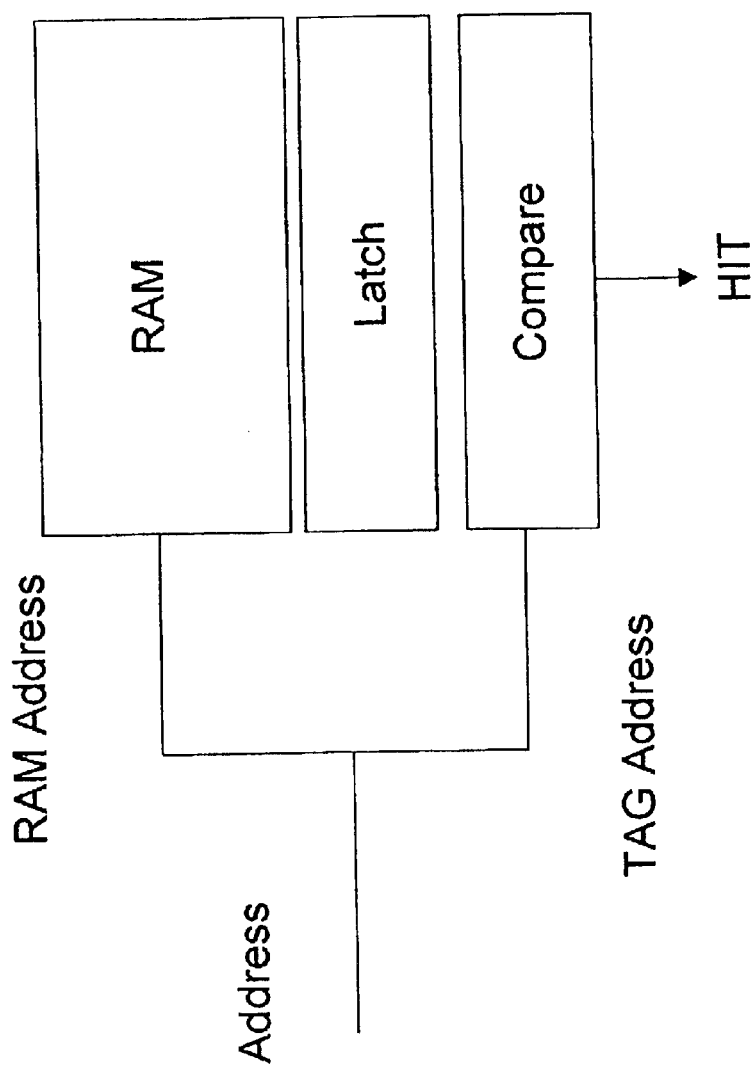
FIG. 1 is a high level illustration of a typical cache directory scheme of the prior art, including an address buss with a RAM, a latch, and a compare functionality.
Figure 2:
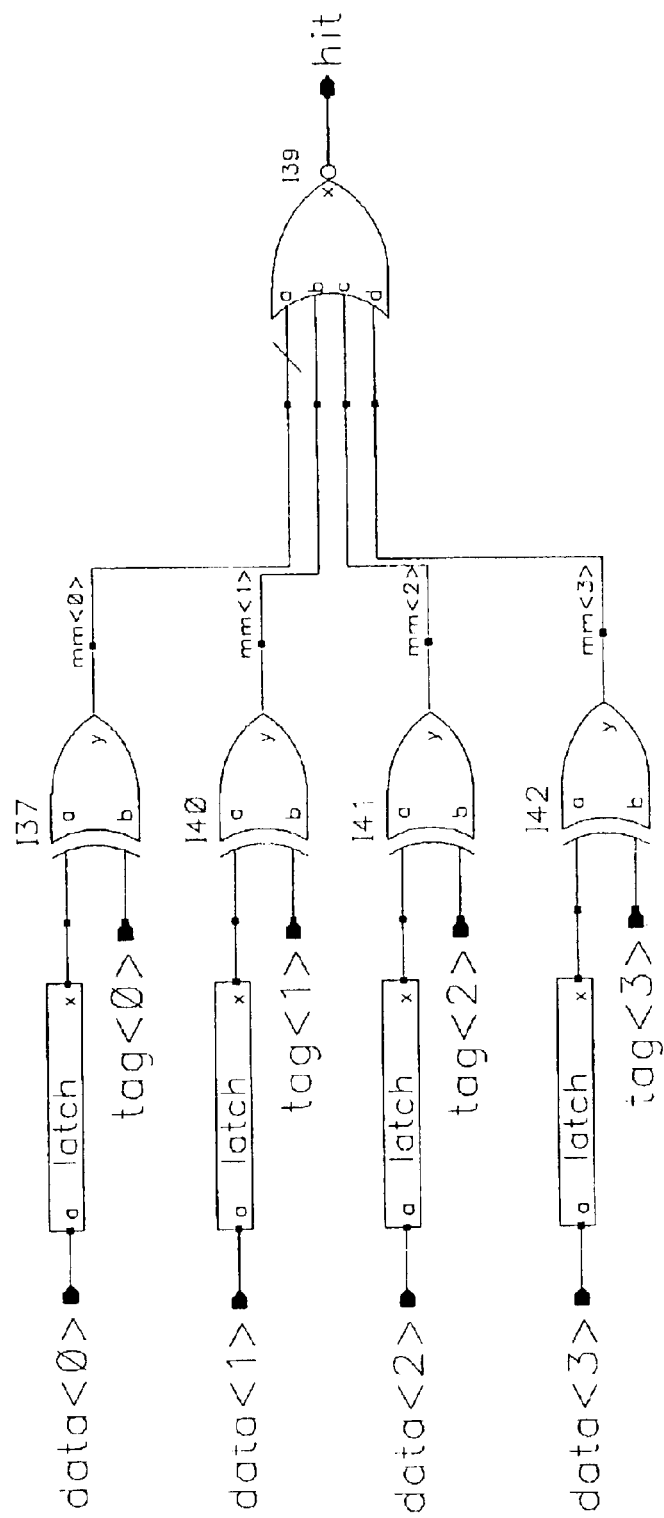
FIG. 2 illustrates a typical cache directory scheme of the prior art with data, data latches, tag data, exclusive or (XOR) gates gating the tag data and the latched data, and an NOR gate to generate a "hit."
Figure 3:
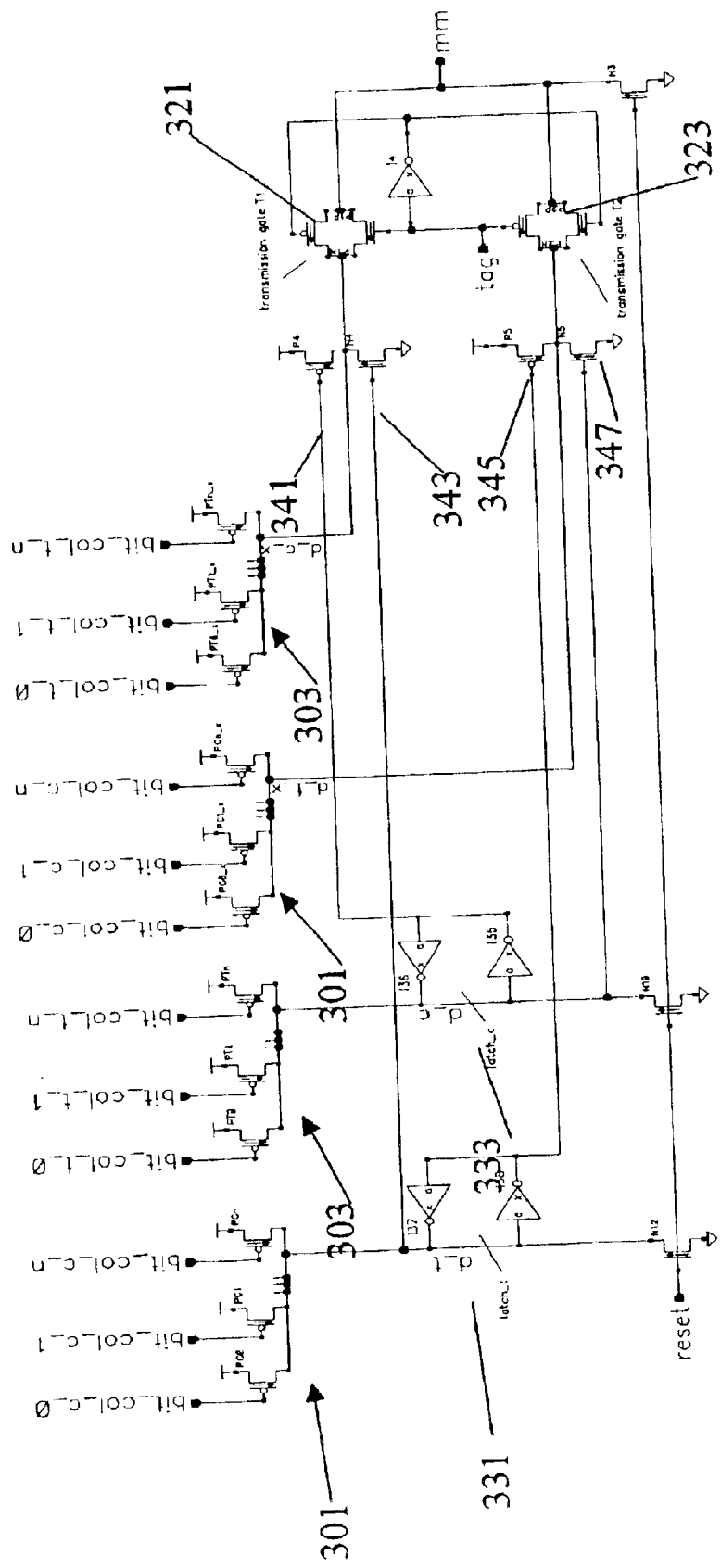
FIG. 3 illustrates a dual rail comparison circuit of the invention.

In the circuit shown in FIG. 3, PMOS transistors PC(n), 301, and PT(n), 303, have been replicated as PC(n)_x, also 301, and PT(n)_x, also 303. These replicated devices are connected directly the inputs of transmission gates T1, 321, and T2, 323. When one of the bit_col_c or bit_col_t signals is pulsed low (following the reset pulse), these replicated transistors drive signals d_t_x and d_c_x directly into transmission gates T1, 321, and T2, 323, while transistors PC(n), 301, and PT(n), 303, write the data into the latch pair, 331 and 333. Since the bit_col signals are negative pulses, once they return to a "I", the d_t_x and d_c_x signals will no longer be driven by the replicated transistors, instead they will be driven (held) by transistor pairs P4, 341, N4, 343, and P5, 345, N5, 347. The connection of these transistors is such that when the latch pair is in the pre-read state, transistors P4–P5 (341, 345) and N4–N5 (343, 347)are non-conducting. Once the latch pair has been set, they serve to replicate the latch values d_t and d_c on nodes d_t_x and d_c_x.

We claim:

1. A latch and compare apparatus for reading and comparing a RAM, said latch and compare apparatus comprising a dual rail output from the RAM and at least two latches associated with the dual rail output, at least one latch indicating if a "0" was read from the RAM and at least one latch indicating a "1" was read from the RAM.

2. A latch and compare apparatus according to claim 1 further comprising a transmission gate XOR for latch and compare output.

3. A latch and compare apparatus according to claim 2 having tag inputs, and data inputs from the RAM.

4. A latch and compare apparatus according to claim 3 wherein the data inputs comprise dual-rail inputs sourcing latch pairs.

5. A latch and compare apparatus according to claim 4 wherein one of the latch pair latches true-data and another one of the latch pair latches complement-data.

6. A latch and compare apparatus according to claim 4 further including two sets of transistor pairs, wherein a. one set of the gates receives data from true and complement outputs of the true-data latch, and b. another of the gates receives data from the complement and true outputs of the complement-data latch.

7. A latch and compare circuit according to claim 6 wherein the transistor pairs hold and drive signals from the latch pairs.

8. A latch and compare circuit according to claim 2 comprising a pair of XOR transmission gates wherein:

a. one of the XOR transmission gate transistor pairs receives as gate inputs tag and inverted tag signals, and b. another of the XOR transmission gate pair receives as gale inputs inverted tag and tag inputs.

9. A latch and compare circuit according to claim 8 wherein:

a. one of the XOR transmission gate transistor pairs receives a true-data signal, and b. another of the XOR transmission gate transistor pairs receives a complement-data signal.

10. A latch and compare apparatus according to claim 9 wherein XOR transmission gate pair outputs a match-mismatch signal.

11. The latch and compare apparatus according to claim 1 wherein said tag input is an input comprising a signal input for each tag address bit.

12. The latch and compare apparatus according to claim 1 wherein said data input is a bit column input comprising an input for each data bit column.

* * * * *